United States Patent
Zhang et al.

(10) Patent No.: US 9,058,038 B2
(45) Date of Patent: Jun. 16, 2015

(54) METHOD AND SYSTEM FOR PREDICTING VEHICLE BATTERY HEALTH USING A COLLABORATIVE VEHICLE BATTERY HEALTH MODEL

(75) Inventors: Yilu Zhang, Northville, MI (US); Mark N. Howell, Rochester Hills, MI (US); Xidong Tang, Royal Oak, MI (US); Fan Bai, Ann Arbor, MI (US); Xinyu Du, Windsor (CA); Satnam Singh, Bangalore (IN)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 275 days.

(21) Appl. No.: 13/433,644

(22) Filed: Mar. 29, 2012

(65) Prior Publication Data

US 2013/0262067 A1    Oct. 3, 2013

(51) Int. Cl.
 *G01R 31/36* (2006.01)
 *G05B 23/02* (2006.01)
 *G07C 5/00* (2006.01)

(52) U.S. Cl.
 CPC .......... *G05B 23/024* (2013.01); *G01R 31/3651* (2013.01); *G07C 5/008* (2013.01); *G05B 23/0283* (2013.01)

(58) Field of Classification Search
 CPC .... G07C 5/0808; G07C 9/00944; G07C 3/00; G07C 5/0816; G07C 5/0858; G07C 9/00134; Y02T 10/7005; Y02T 90/16; Y02T 90/14; Y02T 10/7088; Y02T 90/163; Y02T 90/169; Y02T 10/705; Y02T 90/128; Y02T 10/7044; G01R 31/3651

USPC .................................................. 703/2; 702/63
See application file for complete search history.

(56) References Cited

U.S. PATENT DOCUMENTS

| | | | |
|---|---|---|---|
| 6,546,363 B1* | 4/2003 | Hagenbuch | 703/7 |
| 6,732,063 B2* | 5/2004 | Famili et al. | 702/188 |
| 7,349,825 B1* | 3/2008 | Williams et al. | 702/182 |
| 8,487,628 B2* | 7/2013 | Sciarretta et al. | 324/426 |
| 2004/0162683 A1* | 8/2004 | Verbrugge et al. | 702/64 |
| 2007/0168217 A1* | 7/2007 | Weas et al. | 705/1 |

(Continued)

FOREIGN PATENT DOCUMENTS

WO    WO2011/160258 A1    12/2011

OTHER PUBLICATIONS

Model: IEEE 100 The Authoritative Dictionary of IEEE Standard Terms, Seventh Edition, IEEE Press, 2000, p. 701.*

(Continued)

*Primary Examiner* — Kamini S Shah
*Assistant Examiner* — Scott S Cook
(74) *Attorney, Agent, or Firm* — Mark S. Cohen; Pearl Cohen Zedek Zedek Latzer Baratz LLP (57) ABSTRACT

A method includes collecting vehicle health data from a plurality of vehicles. A peer group is identified among the plurality of vehicles. The collected vehicle health data from the peer group into a collaborative vehicle health model, the collaborative vehicle health model being applicable to a current vehicle to predict a state of at least a component of the current vehicle.

14 Claims, 5 Drawing Sheets

(56) References Cited

U.S. PATENT DOCUMENTS

2009/0005927 A1* 1/2009 Schlatre et al. .................. 701/30
2009/0157461 A1* 6/2009 Wright et al. ...................... 705/8
2009/0192728 A1* 7/2009 Wright et al. .................... 702/33
2010/0030490 A1* 2/2010 Wright et al. .................... 702/34
2010/0121587 A1* 5/2010 Vian et al. ....................... 702/63
2010/0262404 A1* 10/2010 Bertness ....................... 702/183
2011/0248678 A1* 10/2011 Wade et al. .................... 320/119

OTHER PUBLICATIONS

A. Millner "Modeling lithium ion battery degradation in electric vehicles", Proc. IEEE Conf. Innov. Technol. Efficient Rel. Elect. Supply, pp. 349-356 2010.*

Bhaskar Saha, K. Goebel, J. Christophersen Comparison of prognostic algorithms for estimating remaining useful life of batteries Transactions of the Institute of Measurement and Control, 31 (2009), pp. 293-308.*

* cited by examiner

METHOD AND SYSTEM FOR PREDICTING VEHICLE BATTERY HEALTH USING A COLLABORATIVE VEHICLE BATTERY HEALTH MODEL

BACKGROUND

Evaluation of the status or health (diagnosis) of a vehicle or a vehicle system may contribute to efficient operation and maintenance of the vehicle. Diagnosis of the health of the vehicle or the vehicle system may be utilized to yield a prediction (prognosis) of the behavior of the vehicle or vehicle in the future.

Accurate diagnosis and prognosis with regard to vehicle or vehicle system health may be of benefit to the owner or operator of the vehicle, as well as to other parties. For example, accurate prognosis may be used to determine when maintenance should be performed on the vehicle or vehicle system. Such accurate prediction may reduce the possibility of vehicle failure or breakdown if maintenance is unduly delayed. On the other hand, accurate prediction may reduce unnecessary expenditure of time, money, and effort on maintenance that is performed prematurely. Similarly, accurate diagnosis and prognosis may be utilized in creating warranties and warranty conditions, insurance policies, and maintenance schedules.

A vehicle may incorporate a communications system. Such a communications system may operate via an onboard communications device, or via a mobile device (e.g. mobile phone) that is connected to the vehicle. Such a communications system may be operated to provide vehicle-to-vehicle (V2V) communications or vehicle-to-infrastructure (V2I) communications. For example, such communications may be provided to inform a driver or a vehicle control system of hazards that are not currently directly detectable by the vehicle.

SUMMARY

A method includes collecting vehicle health data from a plurality of vehicles. A peer group is identified among the plurality of vehicles. The collected vehicle health data from the peer group into a collaborative vehicle health model, the collaborative vehicle health model being applicable to a current vehicle to predict a state of at least a component of the current vehicle.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. It will however be understood by those skilled in the art that the present invention may be practiced without these specific details. In other instances, well-known methods, procedures, and components have not been described in detail so as not to obscure the present invention.

Unless specifically stated otherwise, as apparent from the following discussions, it is appreciated that throughout the specification discussions utilizing terms such as "processing," "computing," "storing," "determining," "evaluating," "calculating," "measuring," "providing," "transferring," or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Collaborative vehicle health management, in accordance with an embodiment of the present invention, utilizes vehicle communications to create and refine a collaborative vehicle health model for describing and predicting a state of a vehicle, or of a system or component of a vehicle. A vehicle may be provided with one or more sensors that sense a current state ("vehicle health data") of a vehicle, or of a vehicle system or component. Sensor readings from a plurality of vehicles are communicated to a processor.

A subset of the plurality of vehicles (the "peer group") may be sufficiently similar to one another such that sensor readings from the peer group may be relevant to a collaborative vehicle health model for a vehicle, or for a vehicle system or component. ("Vehicle health model" is herein used to refer to a health model for a vehicle, for a particular component of a vehicle, or for a particular system or subsystem of a vehicle.) For example, the vehicles of the peer group, or a system or component of each of the vehicles of the peer group, may be characterized by one or more common or similar characteristics.

The processor may incorporate the received or collected vehicle health data from the peer group into the collaborative vehicle health model. For example, data from sensor readings may be used to calculate or adjust a value of a parameter of the collaborative vehicle health model.

For example, a least mean square error method may be applied in order to adjust one or more parameters of the collaborative vehicle health model in accordance with received vehicle health data. Alternatively, another statistical method may be applied. Such another method may include, for example, application of a restricted maximum likelihood method, a quasi-maximum likelihood estimator, a maximum a posteriori estimator, a method of support, a generalized method of moments, or maximum spacing estimation.

For example, an aging model for a vehicle battery may relate capacity of the battery with current throughput (instantaneous current output integrated over time) of the battery. One or more sensors may measure quantities related to throughput and battery capacity. The sensor readings, or a quantity related to the sensor readings, may be communicated to a processor. By analyzing sensor readings from a plurality of vehicles, the processor may calculate a value of one or more adjustable parameters of the aging model. The battery aging model may then be used to predict the useful lifetime of a battery of a specific vehicle based on measured throughput of that battery. Data from the peer group may also be analyzed to determine a typical usage of the vehicle or battery. In this case, a current capacity of the battery may be estimated on the basis of age of the battery. For example, a capacity prediction of the battery may be utilized to determine when a battery should be replaced (e.g. as close as possible to, but prior to, when the capacity of the battery is so reduced as to render the battery useless).

In another example, a model for wear of brake pads may relate brake pad wear (e.g. a change in thickness of the brake pad) to a number of braking events at a particular brake pad operating temperature. One or more sensors may measure a temperature of the brake pad of a vehicle whenever the brakes of that vehicle are applied. The sensor readings, or a quantity related to the sensor readings, may be communicated to a processor. By analyzing sensor readings from a plurality of vehicles, the processor may calculate a value of one or more adjustable parameters of the brake pad wear model. The brake pad wear model may then be used to predict the wear of a brake pad of a specific vehicle based on a measured distribution of brake operating temperatures for braking events of that vehicle. Data from the peer group may also be analyzed to determine a typical usage of the vehicle or brakes. In this case, wear of the brake pads may be estimated on the basis of number of braking events alone. For example, a prediction of brake pad wear may be utilized to determine when a brake pad should be replaced (e.g. as close as possible to, but prior to, when the wear of the brake pad causes the brake to lose effectiveness).

An updated model (e.g. with updated parameter values) may be communicated to vehicles that are in communication with the processor that updated the model. The updated model may then be utilized by a processor in each vehicle, or by a processor that is in communication with the vehicle, to predict system behavior and enable timely maintenance.

Collaborative vehicle health management, in accordance with an embodiment of the present invention, may be advantageous. For example, traditional accelerated aging testing to predict aging of a vehicle, or of system or component of a vehicle, may consume a large amount of time or resources, and may require careful design so as to mimic actual field usage of the vehicle.

Figure 1:
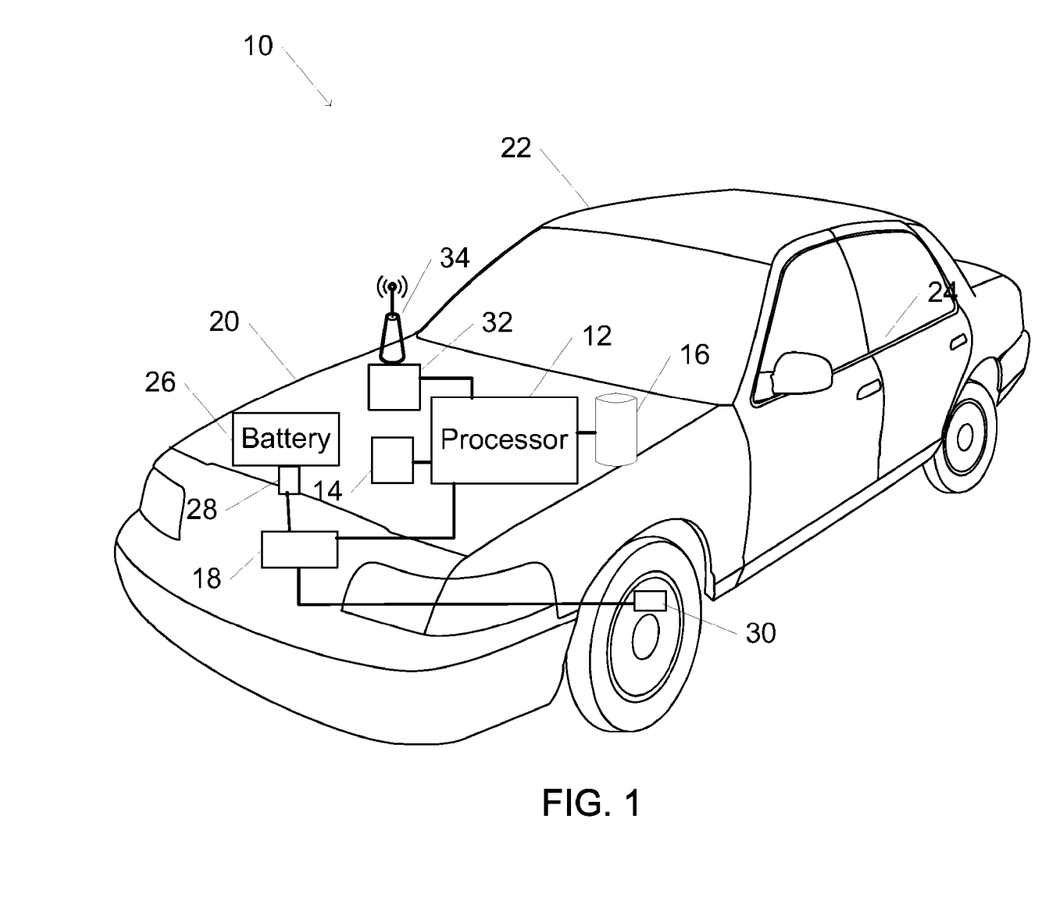
FIG. 1 is a schematic diagram of a vehicle configured for collaborative vehicle health management, in accordance with an embodiment of the present invention.

FIG. 1 is a schematic diagram of a vehicle configured for collaborative vehicle health management, in accordance with an embodiment of the present invention.

A vehicle 10 (e.g., a car, truck, or another vehicle) may include a processor 12. Processor 12 may operate in conjunction with or separate from vehicle monitoring system 18.

Processor 12 may include one or more processing units, e.g. of one or more computers incorporated in vehicle 10, connected to vehicle 10, or remotely located. Processor 12 may be configured to operate in accordance with programmed instructions stored in memory 14. Processor 12 may be capable of operating in accordance with the programmed instructions so as to execute an application or module for collaborative vehicle health management.

Processor 12 may communicate with memory 14. Memory 14 may include one or more volatile or nonvolatile memory devices. Memory 14 may be utilized to store, for example, programmed instructions for operation of processor 12, data or parameters for use by processor 12 during operation, results of operation of processor 12, or sensor data from vehicle monitoring systems 18.

Processor 12 may communicate with data storage device 16. Data storage device 16 may include one or more fixed or removable nonvolatile data storage devices. For example, data storage device 16 may include a computer readable medium for storing program instructions for operation of processor 12. Such instructions may include, for example, instructions for one or more operations or modules related to collaborative vehicle health management. Data storage device 16 may be utilized to store data or parameters for use by processor 12 during operation, results of operation of processor 12, or sensor or other data received from one or more vehicle monitoring systems 18 or from a remote vehicle monitoring system on a remote vehicle.

Data storage device 16 may represent a data storage device that is remote from processor 12. For example, data storage device 16 may represent a storage device of a remote server in the form of an installation package or packages that can be downloaded and installed for execution by processor 12.

Processor 12 may communicate with a processor on another vehicle or with a server or remote processor via communications module 32 and communications device 34. For example, communications module 32 may be configured for vehicle-to-vehicle (V2V communications), vehicle-to-infrastructure (V2I) communications, or communications with a remote device. Communications device 34 may include a wireless device with a capability for line of sight communications (e.g. via visible or infrared radiation), or radio frequency or microwave communications. Communications device 34 may include a component capable of being connected via a wire or connector to a device via which communications device 34 may communicate with another processor or device.

Processor 12 may communicate with vehicle monitoring system 18. For example, processor 12 may be configured to query vehicle monitoring system 18 and to receive sensor data from one or more sensors that are associated with vehicle monitoring system 18. Vehicle monitoring system 18 may include analog or digital processing circuitry or capability for performing processing operations on sensor data (e.g. calibration or conversion) prior to communicating acquired sensor data to vehicle monitoring system 18.

For example, vehicle monitoring system 18 may be associated with one or more battery sensors 28. Battery sensors 28 may be configured to sense a state or activity associated with vehicle battery 26. For example, battery sensor 28 may sense a quantity that is related to a throughput (integral of current over time) or capacity (stored charge) of vehicle battery 26. Vehicle monitoring system 18 may query or received sensed data from battery sensor 28.

As another example, vehicle monitory system 18 may be associated with one or more brake sensors 30. A brake sensor 30 may be configured to sense a state or activity associated with a brake of vehicle 10. For example, brake sensor 30 may be configured to sense a quantity that is operation of a brake (e.g. sensing of braking events and brake pad temperature when braking) or brake pad thickness of a brake of vehicle 10. Vehicle monitoring system 18 may query or received sensed data from brake sensor 30.

One or more components of processor 12, memory 14, data storage device 16, communications module 32, communications device 34, or vehicle monitoring system 18 may be include, incorporated into, or mounted on or in an engine compartment 20, a passenger compartment 22 (e.g. in a dashboard or other interior panel, or in a portable computer, mobile phone, or smart phone that is carried in passenger compartment 22), or baggage compartment 24 (e.g. a trunk) of vehicle 10.

In accordance with an embodiment of the present invention, a vehicle 10 may cooperate with a system for collaborative vehicle health management. For example, processor 12 of vehicle 10 may communicate via communications module 32 and communications device 34 with one or more other vehicles, or with a remote server or other remote device.

Figure 2:
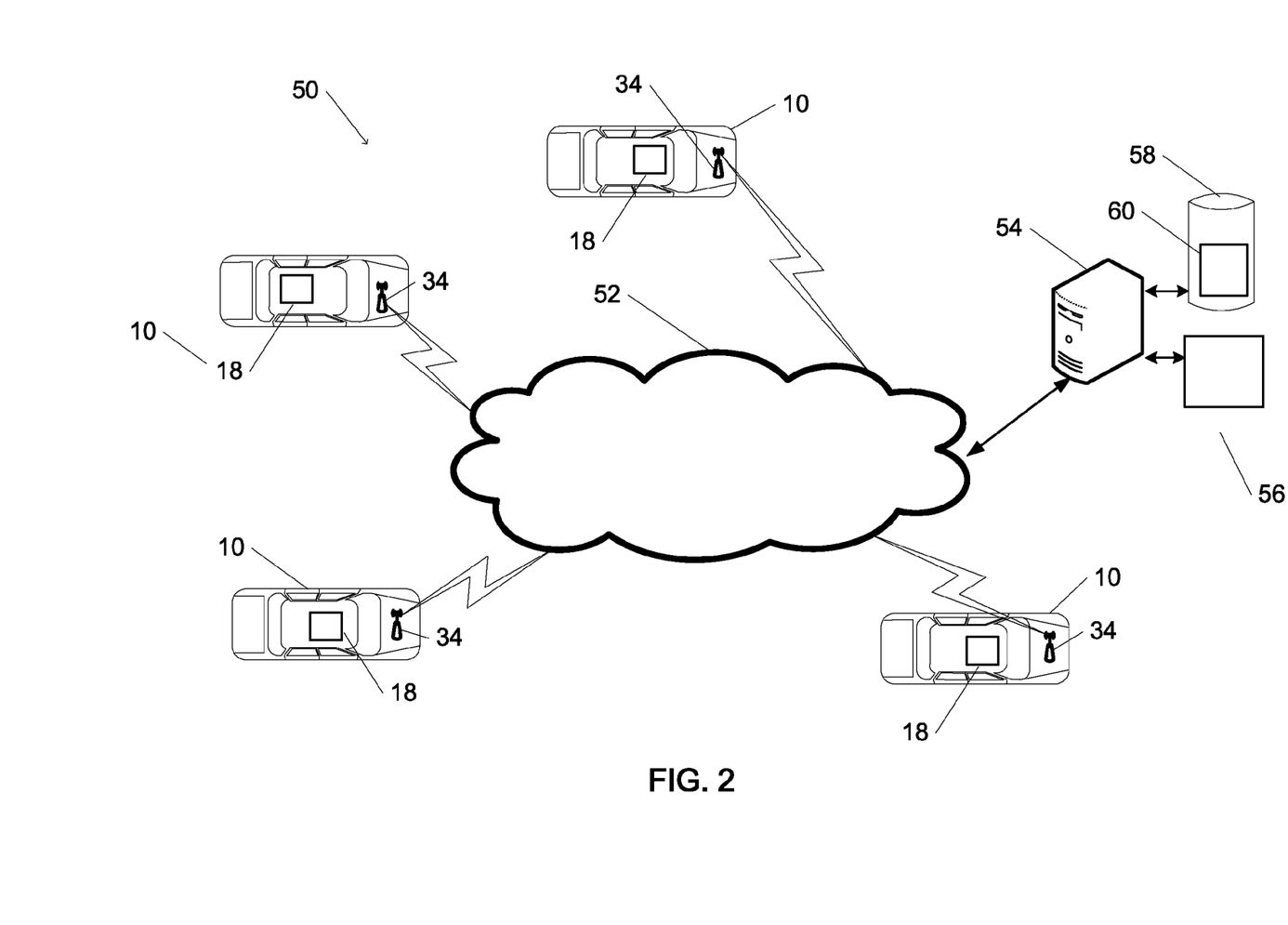
FIG. 2 is a schematic diagram of a system for collaborative vehicle health management, in accordance with an embodiment of the present invention.

FIG. 2 is a schematic diagram of a system for collaborative vehicle health management, in accordance with an embodiment of the present invention.

In collaborative vehicle health system 50, each vehicle 10 communicates with network 52. For example, network 52 may represent any combination of communications paths or networks. Such communications paths or networks may include, for example, the Internet, a mobile phone network, V2V communications, V2I communications, or wireless access to a network. Each vehicle 10 includes at least a vehicle monitoring system 18 for monitoring one or more sensors in vehicle 10, and a communications device 34 for communicating via network 52. A vehicle 10 that is associated with collaborative vehicle health system 50 may include a subgroup of vehicles that are equipped with a vehicle monitoring system 18 and a communications device 34. For example, such a subgroup may include vehicles that subscribe to a collaborative vehicle health providing service.

A vehicle 10 may communicate with server 54 via network 52. Server 54 may include processing functionality in the form of one or more processors, computers, or other devices with processing capability. For example, processing functionality of server 54 may be included in one or more remote stationary computing devices, or in one or more intercommunicating vehicle-mounted devices. For example, processing functionality of server 54 may be included in a processor 12 (FIG. 1) of one or more vehicles 10.

A processor of server 54 may communicate with server memory 56. Server memory 56 may represent one or more local or remote memory devices that may communicate with server 54.

A processor of server 54 may communicate with server data storage device 58. Server data storage device 58 may represent one or more local or remote non-volatile data storage devices that may communicate with server 54. For example, some or all of the data storage functionality of server data storage device 58 may be located in one or more vehicle 10.

Server data storage device 58 may be used to store database 60. For example, database 60 may include data that is collected from a vehicle monitoring system 18 of one or more of vehicles 10.

Server 54 may be operated to execute a method for collaborative vehicle health management, in accordance with an embodiment of the present invention. Execution of the method for collaborative vehicle health management may result in generation or updating of a collaborative vehicle health model for predicting or indicating the health of a vehicle, or of a vehicle system or component. The prediction or indication may be calculated from the model on the basis of measured parameters related to vehicle, or vehicle system or component, operation.

Figure 3:
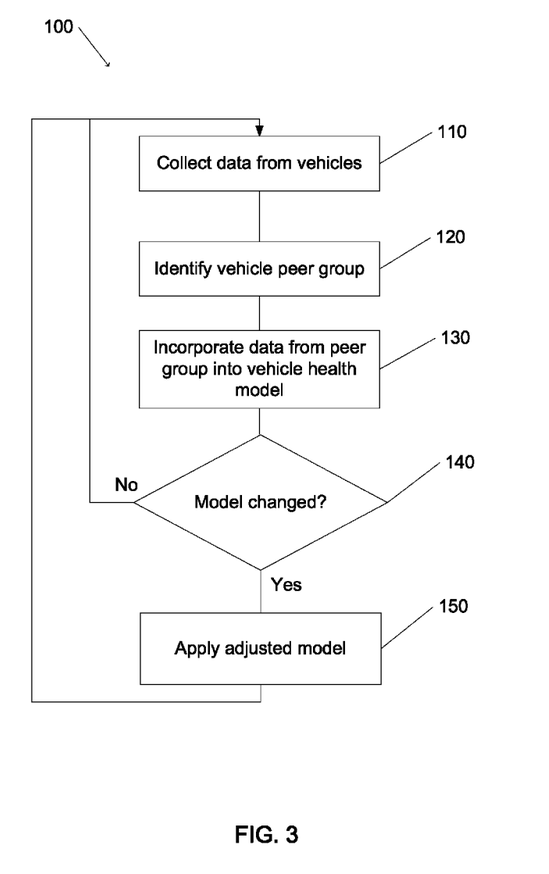
FIG. 3 is a flowchart of a method for collaborative vehicle health management, in accordance with an embodiment of the present invention.

FIG. 3 is a flowchart of a method for collaborative vehicle health management, in accordance with an embodiment of the present invention.

It should be understood that the division of the method illustrated by the flowchart into separate operations, each represented by a block of the flowchart, has been selected for convenience and clarity only. Alternative division of the illustrated method into operations is possible with equivalent results. Such alternative division of the method into operations should be considered as included within the scope of embodiments of the present invention.

It should also be understood that, unless indicated otherwise, the illustrated order of operations as represented by blocks of the flowchart has been selected for the sake of convenience and clarity only. The order of execution of illustrated operations may be modified, or operations of the illustrated method may be executed concurrently, with equivalent results. Such reordering of operations illustrated by blocks of the flowchart should be considered as included within the scope of embodiments of the present invention.

Collaborative vehicle health management method 100 may be executed by a processor of a collaborative vehicle health management system, such as a server or a vehicle onboard computer. For example, collaborative vehicle health management method 100 may be executed continuously, at predetermined intervals, as indicated by one or more sensed conditions, or when initiated by a human operator. For example, one or more operations of collaborative vehicle health management method 100 may be executed periodically in order to update a collaborative vehicle health model as the vehicles age.

Data related to the function or health of a vehicle or one or more vehicle systems may be collected from a group of vehicles (block 110). For example, a group of vehicles may communicate with a processor such as a server or vehicle onboard computer that is executing collaborative vehicle health management method 100. Each vehicle may communicate via a network or other communications channel with the processor. The communicating vehicles may be limited to vehicles that are subscribing to a service, or are otherwise enabled to communicate vehicle health related data to the processor.

Communicated vehicle health data may be saved, for example, in a database. The database may be located at a single location, e.g. in one or more data storage devices that are associated with a server, or may be distributed among intercommunicating devices (e.g. devices that are associated with vehicle onboard processors).

A collaborative vehicle health model for a vehicle, or vehicle system or component, may be expressible in a functional form. For example, a general functional form of an collaborative vehicle health model may be expressible as:

$$y = f(x_1, x_2 | \theta).$$

The variable y represents an indicator of health a vehicle system or component that may be indicative of a useful lifetime of the component. For example, in the case of a vehicle battery, the variable y may represent internal resistance of the battery. In the case of a vehicle brake, the variable y may represent brake pad thickness.

The variable $x_1$ collectively represents a metric of usage of the component. For example, in the case of a battery variable $x_1$ may represent battery throughput (current over time, e.g. in ampere-hours), and in the case of a brake may represent brake pressure, a frequency of brake applications, a number of brake applications, or a combination of the above. The variable $x_2$ collectively represents any environmental factor that may affect lifetime of the component. For example, brake lifetime may be affected by temperature of the brake when braking.

The function f may be of a predetermined functional form. For example, a functional form of f may be related to general theoretical or phenomenological considerations. The function f may be parameterized by one or more parameters. These parameters may be adjusted or calibrated for a particular subgroup of a component or system. These adjustable parameters are collectively represented by the variable $\theta$. The adjustment of parameters $\theta$ may be based on analysis of the collected vehicle health data.

A collaborative vehicle health model that is characterized by a particular set of parameters $\theta$ may be relevant to a subgroup, or peer group, of the vehicles from which vehicle health data was collected. A relevant peer group of the data of the vehicles may be selected as relevant to a collaborative vehicle health model (block 120). The peer group of vehicles may be selected as relevant to a particular collaborative vehicle health model with regard to a particular vehicle system or component. The peer group with regard to a different vehicle system or component may include a different subset of the vehicles.

The peer group to which a particular set of parameters $\theta$ apply may be defined by one or more common characteristics. For example, such a peer group may include all vehicles that include a single type of component or system. A single type of component or system may be characterized by having, for example, a common engine, model number, year of manufacture, or other characteristics. The peer group may be limited to those vehicles that are similar to one another. For example, a group of similar vehicles may be characterized by vehicles having a common or similar type, make, model, year of manufacture, or engine type. The peer group may also be limited to those vehicles that are subject to similar environmental conditions, e.g. operating in the same or similar geographic areas or climate zones. The peer group may similarly be limited to those vehicles that are operated under similar operational conditions, e.g. being either privately owned or owned by a company or fleet, primarily designated for family use, commuting, or business use, or a typical distance driven during standard period of time. The peer group may be limited to vehicles whose age, e.g. measured in days in service or in distance traveled (mileage), is greater than a threshold value (since the data from such vehicles may be more statistically reliable than data from younger vehicles, or more accurate than factory accelerated aging testing).

The selected vehicle health data that was collected from the peer group may be incorporated into the collaborative vehicle health model (block 130). The peer group vehicle health data may be analyzed to adjust one or more parameters of a collaborative vehicle health model.

In analyzing the selected vehicle health data, greater weight may be given to data from older vehicles than to data from younger vehicles.

For example, a battery aging model may be of the form:

$$C_{deg}(t) = C_N e^{-c_z(1-Z_w(t)/1.6Z_{IEC})}$$

where $C_{deg}(t)$ is the capacity of the battery as a function of time t, $C_N$ is a nominal capacity of the battery, $Z_w(t)$ is a weighted throughput (e.g. in units of ampere-hours) of the battery as a function of time (the weight may be a function of such battery-related factors as, e.g., state of charge, battery temperature, or charging or discharging current), and $Z_{IEC}$ represents a standard throughput (as defined by the International Electrotechnical Commission).

The parameter $c_z$ is adjustable. In addition, weights that are incorporated into weighted throughput $Z_w(t)$ may also be adjustable. Parameter $c_z$ and any adjustable weighting factors may be adjusted or calibrated by comparing with vehicle health data collected from a peer group of vehicles with regard to a particular class of batteries (e.g. as defined by type, model number) in a particular type of vehicle (e.g. as defined by engine, make, model, year). For example, the vehicle health data may include measurements that are related to battery throughput $Z_w(t)$ and to battery capacity $C_{deg}(t)$. The collected vehicle health data may be analyzed (e.g. a least squares fit) to yield a value of adjustable parameter $c_z$ or any adjustable weighting factor.

Figure 4:
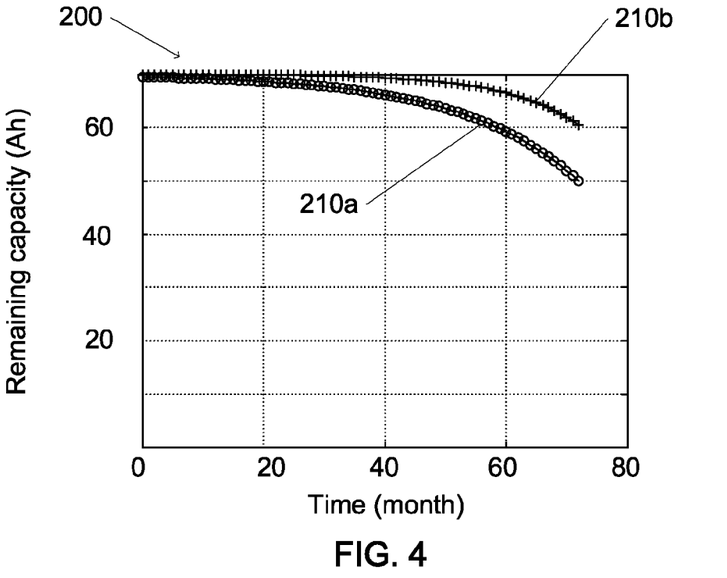
FIG. 4 shows an example of an adjustable model for battery health that is adjustable by application of a method for collaborative vehicle health management, in accordance with an embodiment of the present invention.

FIG. 4 shows an example of an adjustable model for battery health that is adjustable by application of a method for collaborative vehicle health management, in accordance with an embodiment of the present invention. Battery capacity graph 200 illustrates change in battery capacity (in units of ampere-hours) as a function of time that the battery was in use (in units of months). Battery capacity curve 210a illustrates an aging model of the battery with one value (e.g. 5) of the adjustable parameter $c_z$, and battery capacity curve 210b illustrates the aging model with a different value (e.g. 8) of adjustable parameter $c_z$.

As another example, a brake health model may be of the form:

$$w = \sum_{T_i=T_1}^{T_2} \alpha_{T_i} n_{T_i}$$

where w represents a brake pad wear (e.g. in units of millimeters of brake pad), $T_i$ is a brake temperature ranging from $T_1$ (e.g. 100° C.) to $T_2$ (e.g. 400° C.), $n_{T_i}$ is a number of braking events at brake temperature $T_i$, and $\alpha_{T_i}$ is a brake pad wear coefficient (e.g. in units of millimeters of brake pad per 1000 brake events or stops).

Brake pad wear coefficients $\alpha_{T_i}$ are adjustable. Brake pad wear coefficients $\alpha_{T_i}$ may be adjusted or calibrated by comparing with vehicle health data collected from a peer group of vehicles with regard to a particular class of brake pads (e.g. as defined by type, model number) in a particular type of vehicle (e.g. as defined by engine, make, model, year). For example, the vehicle health data may include measurements that are related to brake temperature (e.g. in degrees Celsius), brake wear (e.g. pad thickness in units of millimeters), and number of braking events or stops. The collected vehicle health data may be analyzed (e.g. a least squares fit) to yield a set of values of brake pad wear coefficients $\alpha_{T_i}$.

Figure 5:
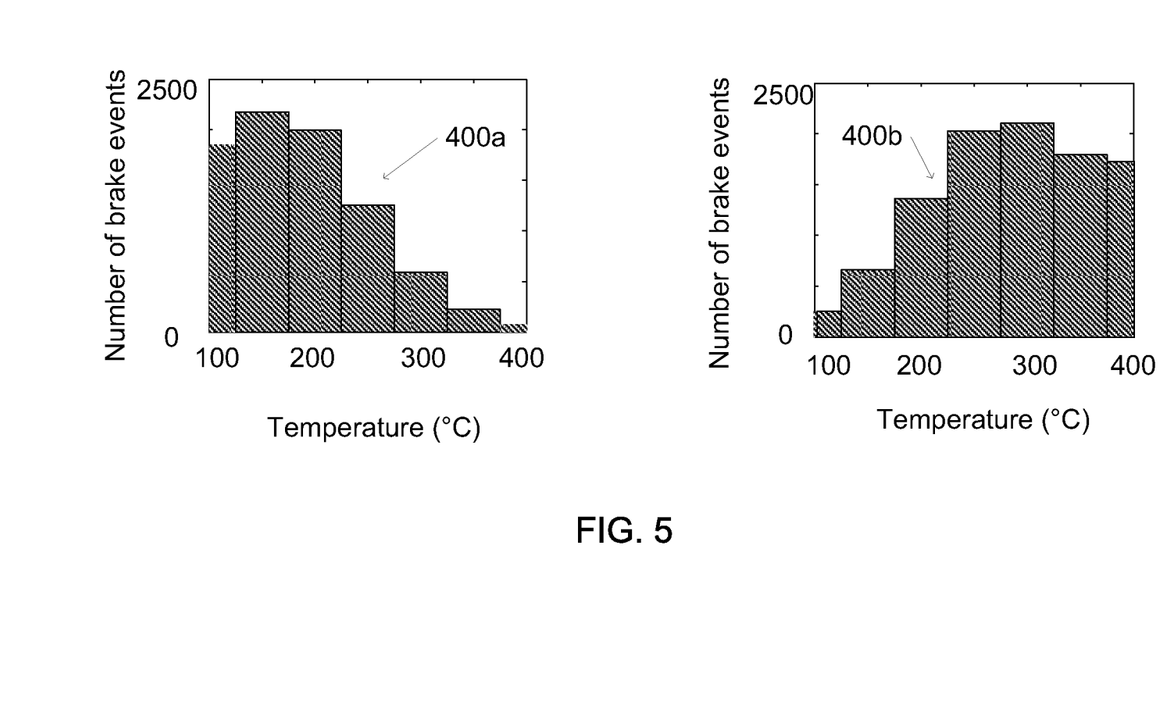
FIG. 5 shows examples of histograms of measured brake use for use in adjusting a model for brake health.

FIG. 5 shows examples of histograms of measured brake use for use in adjusting a model for brake health. Histogram 400a is a histogram of a number of brake events by a vehicle when the brake temperature was in a particular temperature range (in units of degrees Celsius). For example, histogram 400a may be acquired (e.g. from a data storage device of the vehicle) when a brake wear sensor is triggered. For example, a brake wear sensor may be triggered when sensed brake wear (change in brake pad thickness) has progressed beyond a threshold value (or one or more of a series of threshold values). Histogram 400b is a histogram of a number of brake events by a different vehicle.

Histograms such as histograms 400a and 400b, together with other histograms acquired from the peer group of vehicles, may be analyzed to yield a set of values of brake pad wear coefficients $\alpha_{T_i}$.

Figure 6:
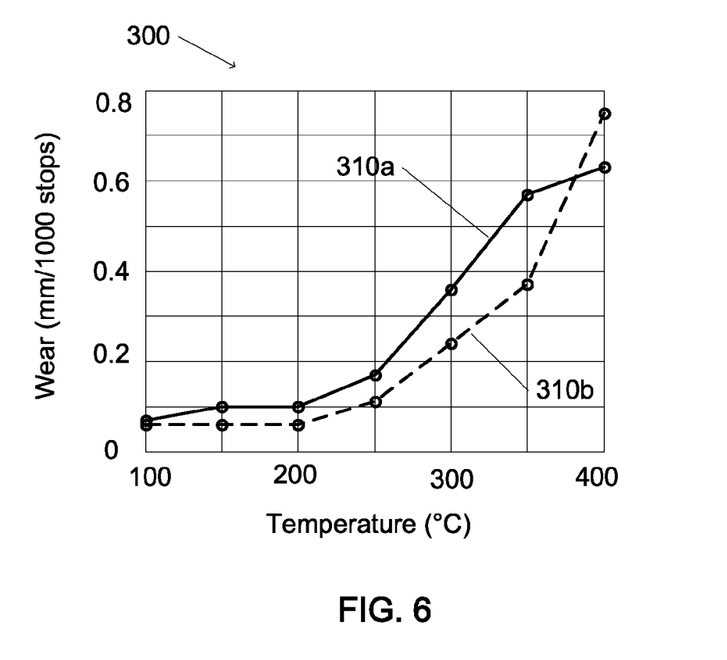
FIG. 6 shows an example of an adjustable brake pad wear coefficients that resulting from application of a method for collaborative vehicle health management, in accordance with an embodiment of the present invention.

FIG. 6 shows an example of an adjustable brake pad wear coefficients that resulting from application of a method for collaborative vehicle health management, in accordance with an embodiment of the present invention.

Brake pad wear coefficient graph 300 illustrates sets of brake pad wear coefficients $\alpha_{T_i}$ (in units of millimeters of brake pad wear per 1000 braking events or stops) as a function brake temperature (in units of degrees Celsius). Brake pad wear coefficient curve 310a illustrates a set of brake pad wear coefficients based on set of measurements for one vehicle. Brake pad wear coefficient curve 310b illustrates a set of brake pad wear coefficients based on a different set of measurements on a different vehicle.

A collaborative vehicle health model that incorporates results of vehicle health data from the selected peer group may represent a change from a previous (or initial) version of the collaborative vehicle health model (block 140 of FIG. 3). For example, an initial version of the collaborative vehicle health model may have been based on calculations or measurements that were made during manufacture or development of a vehicle, or of a vehicle component or system (e.g. using accelerated aging or other estimation techniques). A previous version of the vehicle health system may have resulted from a previous execution of collaborative vehicle health management method 100. Changes that occurred in the collected vehicle health data since the previous execution of collaborative vehicle health management method 100 may result in a revision of one or more parameters in a collaborative vehicle health model. For example, repeated measurements as a group of vehicles are used or age may result in refinement of a collaborative vehicle health model.

If the collaborative vehicle health model has changed, the adjusted collaborative vehicle health model may be applied (block 150). For example, the collaborative vehicle health model may be updated on a server or may be distributed to vehicles. Application of the collaborative vehicle health model may enable predicting a status of a vehicle component or system (e.g. estimated current or projected capacity of a battery, estimated current or projected brake pad wear) based on age of the vehicle or measured usage of the vehicle. The collaborative vehicle health model may be applied by a computer or processor on board each vehicle. Alternatively, the collaborative vehicle health model may be applied by a server or other remote processor or computer upon receipt of relevant data (e.g. age or usage data) from a vehicle.

Whether or not the collaborative vehicle health model has changed, data from vehicles may continue to be collected (returning to block 110) for the purpose of further refinement or verification of the collaborative vehicle health model.

Vehicle health data from a particular vehicle may be acquired and analyzed so as to adapt the collaborative vehicle health model to that particular vehicle (or vehicle component or system). For example, application of the collaborative vehicle health model to that vehicle may yield a prediction of a quantity that is different from a directly measured value of that quantity (e.g. a current battery capacity or current brake pad thickness). One or more parameters of the collaborative vehicle health model may be adjusted with respect to that vehicle only (e.g. in an onboard computer of that vehicle, or in a server when communicating with that vehicle) so as to adapt the collaborative vehicle health model to that vehicle.

Various operations of collaborative vehicle health management method 100 may be executed at different times or with different periodicity. For example, an operation of collecting data from vehicles (block 110) may be executed more often than an operation of incorporating data from the peer group into the collaborative vehicle health model (block 130) or of applying an adjusted model (block 150).

A periodicity for collecting data from vehicles, or for distributing an adjusted model to vehicles, may vary for different vehicle systems. For example, a state of charge of a battery may be collected or incorporated into a collaborative vehicle health model every few ignition cycles. Brake pedal data may be collected, on the other hand, less frequently, e.g. every few days.

Other or different series of operations may be used.

Embodiments of the present invention may include apparatuses for performing the operations described herein. Such apparatuses may be specially constructed for the desired purposes, or may comprise computers or processors selectively activated or reconfigured by a computer program stored in the computers. Such computer programs may be stored in a computer-readable or processor-readable non-transitory storage medium, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions. It will be appreciated that a variety of programming languages may be used to implement the teachings of the invention as described herein. Embodiments of the invention may include an article such as a non-transitory computer or processor readable non-transitory storage medium, such as for example a memory, a disk drive, or a USB flash memory encoding, including or storing instructions, e.g., computer-executable instructions, which when executed by a processor or controller, cause the processor or controller to carry out methods disclosed herein. The instructions may cause the processor or controller to execute processes that carry out methods disclosed herein.

Different embodiments are disclosed herein. Features of certain embodiments may be combined with features of other embodiments; thus, certain embodiments may be combinations of features of multiple embodiments. The foregoing description of the embodiments of the invention has been presented for the purposes of illustration and description. It is not intended to be exhaustive or to limit the invention to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes as fall within the true spirit of the invention.

What is claimed is:

1. A method for predicting replacement time of a vehicle battery comprising:
   providing a processor configured to:
      collect battery performance data from a plurality of vehicles though a wireless receiver;
      identify the battery performance data associated with vehicles belonging to a peer group defined by a mutual year of manufacture;
      apply a statistical operation to the battery performance data so as to calculate an adjustment parameter reflecting the mutual year of manufacture;
      use a collaborative health model incorporating the adjustment factor to predict a replacement date of a battery of a vehicle associated with the peer group, the collaborative health model implemented as $$C_{deg}(t) = C_N e^{-c_z(1-Z_w(t)/1.6Z_{IEC})},$$

wherein $C_{deg}(t)$ is time dependent, battery capacity, $C_N$ is nominal battery capacity, $Z_{w(t)}$ is time dependent, weighted throughput, $Z_{IEC}$ is a standard throughput value, and $c_z$ is the adjustable parameter.

2. The method of claim 1, wherein peer group is further defined by a common model of the vehicles.

3. The method of claim 2, wherein the peer group is further defined by a common geographical area of operation.

4. The method of claim 2, wherein the peer group is further defined by a common climate to which the vehicles are subject.

5. The method of claim 2, wherein the peer group is further defined by similar operational conditions.

6. The method of claim 1, wherein the statistical operation includes a least mean square error operation.

7. The method of claim 1, the statistical operation is selected from the group consisting of application of a restricted maximum likelihood method, a quasi-maximum likelihood estimator, a posteriori estimator, a method of support, a generalized method of moments, or a maximum spacing estimation.

8. A system for predicting a replacement time of a vehicle battery, the system comprising:
   a processor in communication with a wireless network, the processor configured to:
      collect battery performance data from a plurality of vehicles though a wireless receiver;
      identify the battery performance data associated with vehicles belonging to a peer group defined by a mutual year of manufacture;
      apply a statistical operation to the battery performance data so as to calculate an adjustment parameter reflective of the mutual year of manufacture;
      use a collaborative health model incorporating the adjustment factor to predict a replacement date of a battery of a vehicle associated with the peer group, the collaborative health model implemented as $C_{deg}(t) = C_N e^{-c_z(1-Z_w(t)/1.6Z_{IEC})}$,
   wherein $C_{deg}(t)$ is time dependent, battery capacity, $C_N$ is nominal battery capacity, $Z_{w(t)}$ is time dependent, weighted throughput, $Z_{IEC}$ is a standard throughput value, and $c_z$ is the adjustable parameter.

9. The system of claim 8, wherein peer group is further defined by a common model of the vehicles.

10. The system of claim 9, wherein the peer group is defined by a common geographical area of operation.

11. The system of claim 9, wherein the peer group is further defined by a common climate to which the vehicles are subject.

12. The system of claim 9, wherein the peer group is further defined by similar operational conditions.

13. The system of claim 8, wherein the statistical operation includes a least mean square error operation.

14. The system of claim 8, wherein the statistical operation is selected from the group consisting of application of a restricted maximum likelihood method, a quasi-maximum likelihood estimator, a posteriori estimator, a method of support, a generalized method of moments, or a maximum spacing estimation.

* * * * *